United States Patent
Trinh et al.

(10) Patent No.: US 9,627,613 B2
(45) Date of Patent: Apr. 18, 2017

(54) RESISTIVE RANDOM ACCESS MEMORY (RRAM) CELL WITH A COMPOSITE CAPPING LAYER

(71) Applicant: Taiwan Semiconductor Manufacturing Co., Ltd., Hsin-Chu (TW)

(72) Inventors: Hai-Dang Trinh, Hsinchu (TW); Cheng-Yuan Tsai, Chu-Pei (TW); Hsing-Lien Lin, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 14/663,860

(22) Filed: Mar. 20, 2015

(65) Prior Publication Data
US 2016/0276586 A1    Sep. 22, 2016

(51) Int. Cl.
*H01L 45/00* (2006.01)
*H01L 27/24* (2006.01)

(52) U.S. Cl.
CPC .......... *H01L 45/1253* (2013.01); *H01L 45/08* (2013.01); *H01L 45/1233* (2013.01); *H01L 45/16* (2013.01)

(58) Field of Classification Search
CPC . H01L 45/1233; H01L 45/1253; H01L 45/08; H01L 45/16
See application file for complete search history.

(56) References Cited

U.S. PATENT DOCUMENTS

| | | | | |
|---|---|---|---|---|
| 2009/0272962 A1* | 11/2009 | Kumar | ..................... | H01L 45/08 257/4 |
| 2011/0227026 A1* | 9/2011 | Sekar | ................. | G11C 13/0007 257/4 |
| 2011/0291066 A1* | 12/2011 | Baek | ....................... | H01L 45/08 257/4 |
| 2013/0334483 A1* | 12/2013 | Ramaswamy | .......... | H01L 45/08 257/2 |
| 2014/0203234 A1* | 7/2014 | Ninomiya | ............. | H01L 45/145 257/2 |

OTHER PUBLICATIONS

Yang Yin Chen, et al.; "Endurance/Retention Trade-off on HfO2/Metal Cap 1T1R Bipolar RRAM"; IEEE Transactions on Electron Devices, vol. 60, No. 3, Mar. 2013, p. 1114-1121.
H.-S. Philip Wong, et al.; "Metal-Oxide RRAM"; Proceedings of the IEEE, vol. 100, No. 6, Jun. 2012, p. 1951-1970.

* cited by examiner

*Primary Examiner* — Christine Enad
(74) *Attorney, Agent, or Firm* — Eschweiler & Potashnik, LLC

(57) ABSTRACT

A resistive random access memory (RRAM) cell with a composite capping layer is provided. A tantalum oxide based layer is arranged over a bottom electrode layer. The composite capping layer is arranged over and abutting the tantalum oxide based layer. The composite capping layer includes a first metal layer and a second metal layer overlying the first metal layer. The first metal layer is more reactive with the tantalum oxide based layer than the second metal layer. A top electrode layer is arranged over the composite capping layer. A method for manufacturing the RRAM cell is also provided.

17 Claims, 8 Drawing Sheets

RESISTIVE RANDOM ACCESS MEMORY (RRAM) CELL WITH A COMPOSITE CAPPING LAYER

BACKGROUND

Many modern day electronic devices contain electronic memory. Electronic memory may be volatile memory or non-volatile memory. Non-volatile memory is able to store data in the absence of power, whereas volatile memory is not. Resistive random access memory (RRAM) is one promising candidate for next generation non-volatile memory due to its simple structure and its compatibility with complementary metal-oxide-semiconductor (CMOS) logic fabrication processes.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
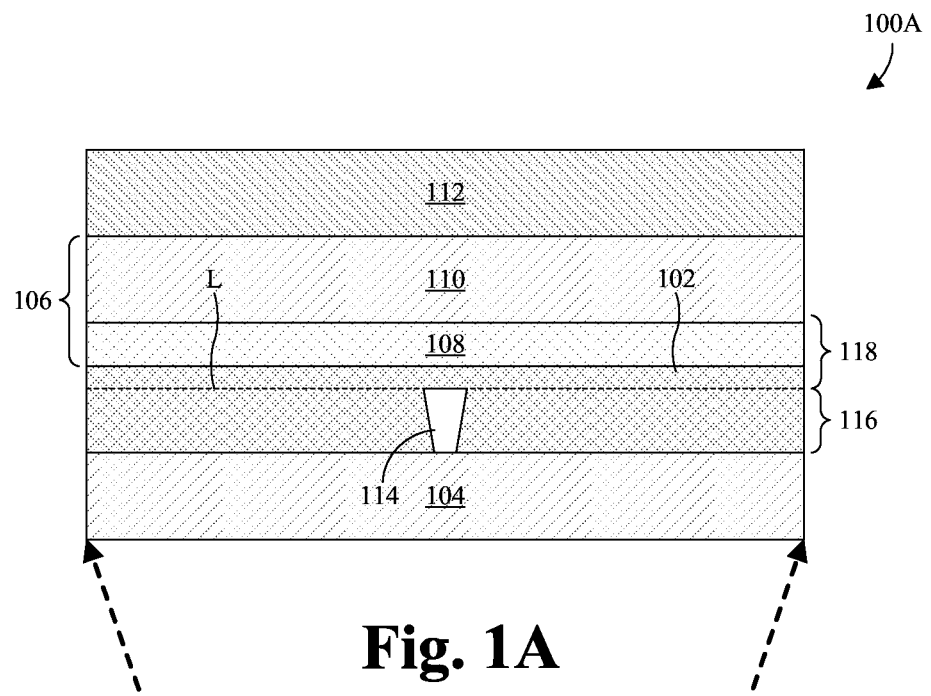
FIG. 1A illustrates a cross-sectional view of some embodiments of a resistive random access memory (RRAM) cell with a composite capping layer.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Moreover, "first", "second", "third", etc. may be used herein for ease of description to distinguish between different elements of a figure or a series of figures. "first", "second", "third", etc. are not intended to be descriptive of the corresponding element. Therefore, "a first dielectric layer" described in connection with a first figure may not necessarily corresponding to a "first dielectric layer" described in connection with another figure.

Resistive random access memory (RRAM) cells include a high κ layer (i.e., a layer with a dielectric constant κ greater than 3.9) and a capping layer stacked between top and bottom electrodes. The high κ layer and the capping layer react to define a data storage region (e.g., a lower region of the high κ layer) and an ion reservoir region (e.g., an upper region of the high κ layer). The data storage region includes a variable resistance that represents a unit of data, such as a bit of data. The ion reservoir region stores mobile oxygen ions and mobile oxygen vacancies. Through application of a voltage between the top and bottom electrodes, oxygen ions and oxygen vacancies can be moved between the ion reservoir and the data storage region to change a resistance of the data storage region.

According to some RRAM cells, the high κ layer includes at least tantalum and oxygen, such as tantalum hafnium oxide, and the capping layer includes tantalum. Compared to hafnium oxide based RRAM cells, tantalum oxide based RRAM cells have better read disturb (e.g., it takes more read cycles to disturb a neighboring RRAM cell). Further, tantalum oxide based RRAM cells have good pre-cycling data retention (e.g., data retention before cycling to test endurance). However, tantalum oxide based RRAM cells have poor endurance and poor post-cycling data retention (i.e., data retention after cycling to test endurance). Further, tantalum oxide based RRAM cells have small switching windows.

The foregoing shortcomings with tantalum oxide based RRAM cells can at least partially be attributed to the capping layer. The tantalum capping layer has a low reactivity with the high κ layer, and therefore leads to a small ion reservoir region with few mobile oxygen ions and oxygen vacancies. One approach for increasing the size of the ion reservoir region is to use a titanium capping layer. The titanium capping layer has a high reactivity with the high κ layer, relative to the tantalum capping layer, and therefore leads to a large ion reservoir region with many mobile oxygen ions and oxygen vacancies. However, the large ion reservoir region may be too large and may lead to a high leakage current that prevents operation of the RRAM cell.

In view of the foregoing, the present application is directed to a tantalum oxide based RRAM cell having improved endurance, improved post-cycling data retention, and an enlarged switching window. The improved RRAM cell includes a high κ layer and an overlying composite capping layer stacked between top and bottom electrodes. The high κ layer includes at least tantalum and oxygen. The composite capping layer includes a high reactivity metal layer and a low reactivity metal layer overlying the high reactivity metal layer. For example, the low and high reactivity metal layers may be respectively tantalum and titanium. Further, the low reactivity metal layer is thin, so as to limit the extent of the reaction with the high κ layer. For example, the low reactivity metal layer may be less than about 70 angstroms thick.

Advantageously, by using tantalum oxide for the high κ layer, read disturb and pre-cycling data retention are improved. Further, by using a composite capping layer with a high reactivity metal layer, the size of the ion reservoir region is increased. The increased size improves the quantity of mobile oxygen ions and mobile oxygen vacancies, which improves the size of the switching window, endurance, and post-cycling data retention. Even more, by limiting the thickness of the high reactivity metal layer, leakage current is limited.

With reference to FIG. 1A, a cross-sectional view of some embodiments of a RRAM cell 100A is provided. As illustrated, a high κ layer 102 (i.e., a layer with a dielectric constant κ greater than 3.9) comprising tantalum and oxygen is arranged over a bottom electrode 104. The high κ layer 102 may be, for example, tantalum oxide, tantalum hafnium oxide, tantalum aluminum oxide, or another material that includes tantalum, oxygen, and one or more other elements. The bottom electrode 104 may be, for example, a conductive material, such as titanium nitride, tantalum nitride, platinum, iridium, tungsten, or ruthenium.

A composite capping layer 106 is arranged over and abuts the high κ layer 102. In some embodiments, a thickness of the composite capping layer 106 is about ½ to about ⅓ the thickness of the high κ layer 102. The composite capping layer 106 includes a high reactivity metal layer 108 and a low reactivity metal layer 110 stacked in that order. A top electrode 112 is arranged over the composite capping layer 106. The top electrode 112 may be, for example, a conductive material, such as doped polysilicon, titanium nitride, tantalum nitride, platinum, iridium, or tungsten.

In operation, and during manufacture, voltages are applied between the top and bottom electrodes 104, 112. For example, a voltage may be applied between the top and bottom electrodes 104, 112 to form the one or more conductive filaments 114 and/or to trigger reactions between the high κ layer 102 and the composite capping layer 106. As another example, a voltage may be applied between the top and bottom electrodes 104, 112 to read, set, or erase the RRAM cell 100A. Due to lower oxygen concentrations in the low and high reactivity metal layers 108, 110, the reactions between the high κ layer 102 and the composite capping layer 106 extract oxygen from the high κ layer 102, thereby bisecting the high κ layer 102 into the lower and upper regions of the high κ layer 102 (demarcated by a thin, dashed line L). The upper region has a reduced concentration of oxygen relative to the lower region.

In some embodiments, the lower region of the high κ layer 102 defines a data storage region 116. The data storage region 116 has a variable resistance representing a unit of data, such as a bit of data. The variable resistance is configured to vary (i.e., change) in response to external electric fields generated by the top and bottom electrodes 104, 112. The variable resistance varies between comparatively low and high resistance states depending upon whether one or more conductive filaments 114 of the data storage region 116 are fully or partially formed. For example, the variable resistance is in a low resistance state when the one or more conductive filaments 114 are fully formed, and the variable resistance is in a comparatively high resistance state when the one or more conductive filaments 114 are partially formed. The one or more conductive filaments 114 may extend between top and bottom surfaces of the data storage region 116, and correspond to oxygen vacancies aligned between the top and bottom surfaces of the data storage region 116.

In some embodiments, the high reactivity metal layer 108 and the upper region of the high κ layer 102 collectively define an ion reservoir region 118 overlying and abutting the data storage region 116. In some embodiments, the ion reservoir region 118 further extends into, or otherwise includes, the low reactivity metal layer 110. To the extent that the ion reservoir region 118 extends into the low reactivity metal layer 110, it is typically minimal and/or less than about 10 angstroms. The ion reservoir region 118 stores mobile oxygen ions and mobile oxygen vacancies to facilitate resistance changes within the data storage region 116. Resistance changes in the data storage region 116 are typically performed through application of a voltage across the data storage and ion reservoir regions 116, 118. The voltage moves oxygen ions between the data storage and ion reservoir regions 116, 118, thereby changing the resistance of the data storage region 116. For example, when a reset voltage is applied, oxygen ions move from the ion reservoir region 118 to the data storage region 116, thereby combining with the oxygen vacancies of the conductive filaments and partially breaking the one or more conductive filaments 114. As another example, when a set voltage is applied, oxygen ions move from the data storage region 116 to the ion reservoir region 118, thereby forming oxygen vacancies that form or repair the one or more conductive filaments 114.

Using the high reactivity metal layer 108, in addition to the low reactivity metal layer 110, advantageously increases the size of the ion reservoir region 118. This increases the size of the switching window and improves endurance, since the amount of mobile oxygen ions and mobile oxygen vacancies moving between states is increased. For example, the density of oxygen vacancies forming the conductive filament is greater, which leads to a higher on-state current. The switching window size corresponds to the difference between the resistances or currents of the RRAM cell 100A in the high and low states.

Figure 1B:
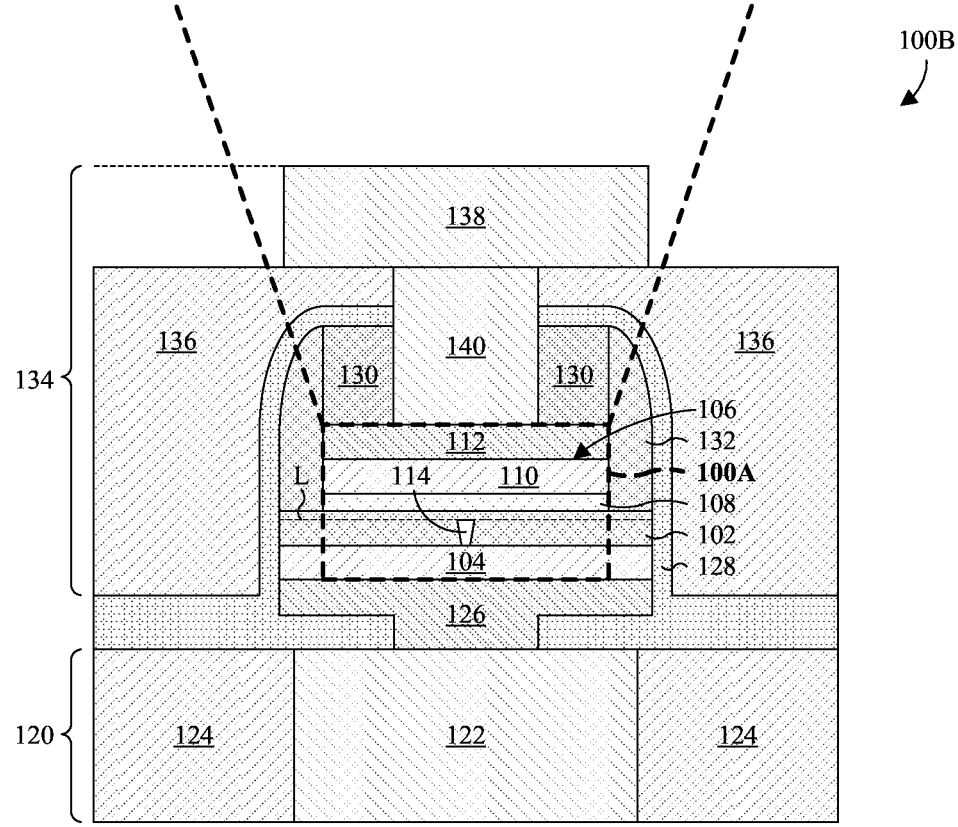
FIG. 1B illustrates a cross-sectional view of some embodiments of an integrated circuit with the RRAM cell of FIG. 1A.

With reference to FIG. 1B, a cross-sectional view 100B is provided for some embodiments of an integrated circuit with the RRAM cell 100A of FIG. 1A. The RRAM cell 100A is arranged over a semiconductor substrate (not shown) with a bottom interconnect structure 120 (partially shown) of a back-end-of-line (BEOL) metallization stack arranged between the RRAM cell 100A and the semiconductor substrate. The bottom interconnect structure 120 includes one or more bottom metallization layers 122 stacked within a bottom interlayer dielectric (ILD) layer 124. The bottom ILD layer 124 may be, for example, an oxide or an extreme low-κ dielectric (i.e., a dielectric with a dielectric constant κ less than about 2), and the bottom metallization layers 122 may be, for example, a metal, such as copper.

A bottom electrode 104 of the RRAM cell 100A is arranged over the bottom interconnect structure 120. In some embodiments, the bottom electrode 104 is arranged in electrical communication with the bottom interconnect structure 120 through a diffusion barrier layer 126 arranged between the bottom electrode 104 and the bottom interconnect structure 120. The diffusion barrier layer 126 prevents material from diffusing between the bottom interconnect structure 120 and the bottom electrode 104. The diffusion barrier layer 126 includes a top region and a bottom region. The bottom region includes a smaller footprint than the top region and extends vertically down from the top region to the bottom interconnect structure 120 through an insulating layer 128 encapsulating the RRAM cell 100A. The bottom electrode 104 may be a conductive material, such as titanium nitride. The diffusion barrier layer 126 may be, for example, a conductive material, such as platinum, iridium, ruthenium or tungsten. The insulating layer 128 may be, for example, a dielectric material, such as silicon dioxide or silicon nitride.

A high κ layer 102 is arranged over the bottom electrode 104, and a composite capping layer 106 is arranged over and abuts the high κ layer 102. The high κ layer 102 is bisected into lower and upper regions (demarcated by a dashed line L), which have different concentrations of oxygen. Further, the lower region of the high κ layer 102 includes one or more conductive filaments 114. The composite capping layer 106 includes a high reactivity metal layer 108 and a low reactivity metal layer 110 overlying the high reactivity metal layer 108. Further, the composite capping layer 106 has a smaller footprint than the high κ layer 102. During manufacture, the composite capping layer 106 reacts with the high κ layer 102 to bisect the high κ layer 102 into the lower and upper regions of the high κ layer 102.

The reactivities of the metal layers 108, 110 are with respect to the high κ layer 102, and relative to each other. Further, the reactivities are proportional to the amount of oxygen extracted from the high κ layer 102. In some embodiments, the reactivities may be quantified in terms of the amounts of energy used to trigger the reactions between the metal layers 108, 110 and the high κ layer 102. In such embodiments, the higher the reactivity, the less energy used to trigger a reaction. For example, the high reactivity metal layer 108 may use less than about 1 electron volt to react with the high κ layer 102, whereas the low reactivity metal layer 110 may use more than about 2 electron volts to react with the high κ layer 102.

The high reactivity metal layer 108 is typically thin, relative to the low reactivity metal layer 110. In some embodiments, the high reactivity metal layer 108 has a thickness of less than about 70 angstroms, such as between about 10-40 angstroms. If the high reactivity metal layer 108 were thicker, too much oxygen may be extracted, thereby leading to too much leakage current for the RRAM cell 100A to function. Further, in some embodiments, the low reactivity metal layer 110 has a greater thickness than the high reactivity metal layer 108. For example, the low reactivity metal layer 110 may have a thickness of greater than about 70 angstroms, such as between about 75-150 angstroms or between about 95-125 angstroms. The high reactivity metal layer 108 may be, for example, hafnium, titanium, zirconium, or lanthanum, which typically use less than about 1 electron volt for a reaction with the high κ layer 102. Further, the low reactivity metal layer 110 may be, for example, tantalum, aluminum, tungsten, ruthenium, platinum, nickel, copper, or gold, which typically use more than about 2 electron volts for a reaction with the high κ layer 102.

A top electrode 112 of the RRAM cell 100A is arranged over the composite capping layer 106, and a hard mask 130 is arranged over the composite capping layer 106. The top electrode 112 may be, for example, a conductive material, such as doped polysilicon, titanium nitride, tantalum nitride, platinum, iridium, or tungsten. The hard mask 130 is residual material from the manufacture of the RRAM cell 100A. Further, the hard mask 130 may be, for example, a dielectric, such as silicon dioxide or silicon nitride.

In some embodiments, a spacer layer 132 surrounds the composite capping layer 106, the hard mask 130, and the top electrode 112 along sidewalls of the composite capping layer 106, the hard mask 130, and the top electrode 112. The spacer layer 132 prevents leakage between the top and bottom electrodes 104, 112 and is used during the manufacture of the RRAM cell 100A to define a foot print of the bottom electrode 104, the high κ layer 102, and the diffusion barrier layer 126. The spacer layer 132 may be, for example, silicon nitride or a multilayer oxide-nitride-oxide film.

A top interconnect structure 134 of the BEOL metallization stack is arranged over the bottom interconnect structure 120. The top interconnect structure 134 includes a top ILD layer 136 surrounding the insulating layer 128 and a top metallization layer 138 overlying a top ILD layer 136. Further, the top interconnect structure 134 includes a via 140 extending from the top metallization layer 138 to the top electrode 112 through the top ILD layer 136, the insulating layer 128, and the hard mask 130 to electrically connect the top electrode 112 to the top metallization layer 138. The top ILD layer 136 may be, for example, an oxide or an extreme low-κ dielectric, and the top metallization layer 138 and the via 140 may be, for example, a metal, such as copper, aluminum, or tungsten.

Figure 2:
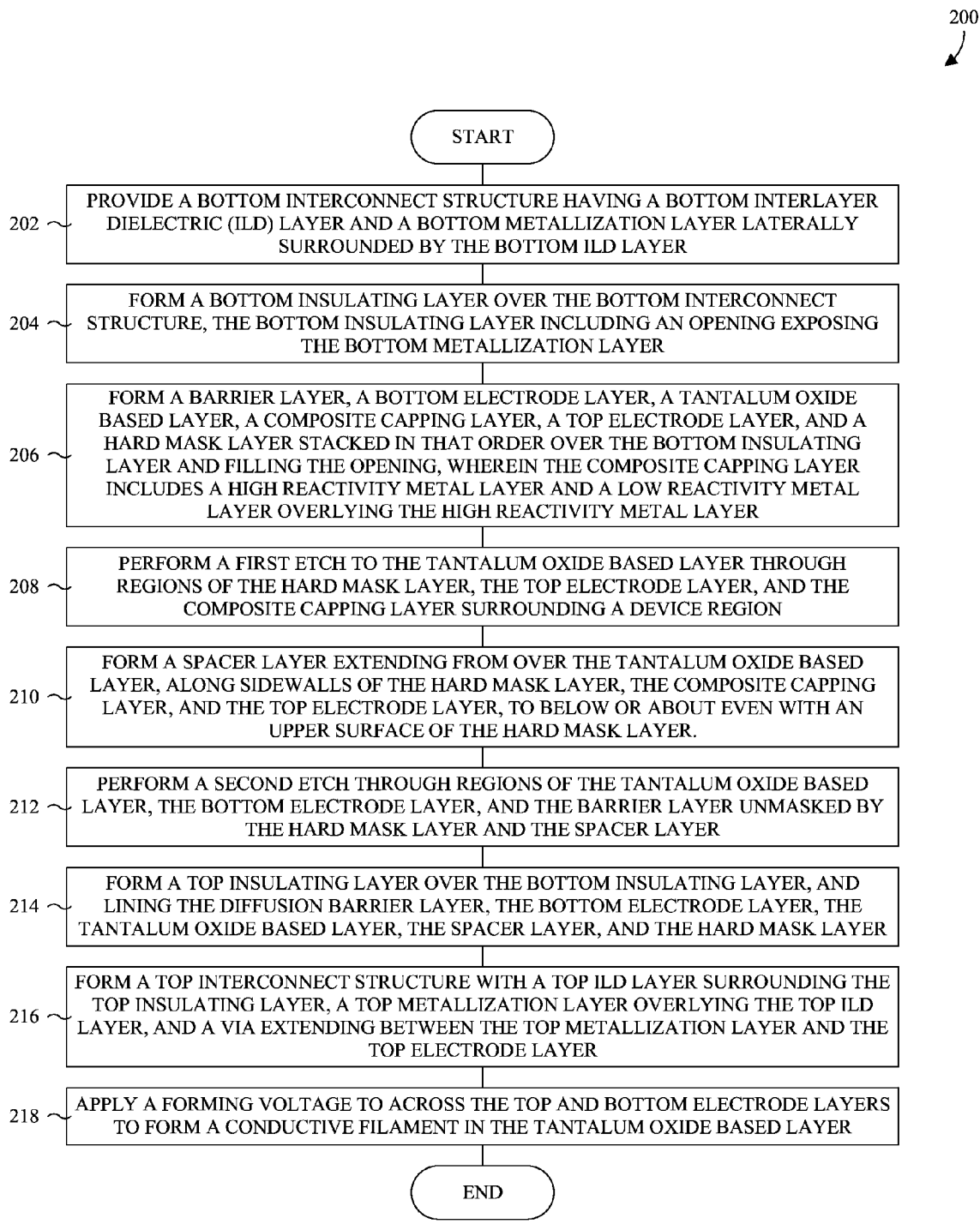
FIG. 2 illustrates a flowchart of some embodiments of a method for manufacturing an integrated circuit with a RRAM cell.

With reference to FIG. 2, a flowchart 200 provides some embodiments of a method for manufacturing an integrated circuit with a RRAM cell.

At 202, a bottom interconnect structure is provided, having a bottom metallization layer laterally surrounded by a bottom ILD layer.

At 204, a bottom insulating layer is formed over the bottom interconnect structure. The bottom insulating layer includes an opening exposing the bottom metallization layer.

At 206, a barrier layer, a bottom electrode layer, a tantalum oxide based layer, a composite capping layer, a top electrode layer, and a hard mask layer are formed stacked in that order over the bottom insulating layer and filling the opening. The composite capping layer includes a high reactivity metal layer and a low reactivity metal layer overlying the high reactivity metal layer. Advantageously, by using the tantalum oxide layer for the RRAM cell, read disturb and pre-cycling data retention are improved. Further, by using the composite capping layer with a high reactivity metal layer, the size of an ion reservoir region is increased. The increased size improves the quantity of mobile oxygen ions and mobile oxygen vacancies, which improves the size of the switching window, endurance, and post-cycling data retention. Even more, by limiting the thickness of the high reactivity metal layer, leakage current is limited.

At 208, a first etch is performed to the tantalum oxide based layer through regions of the hard mask layer, the top electrode layer, and the composite capping layer surrounding a device region.

At 210, a spacer layer is formed extending from over the tantalum oxide based layer, along sidewalls of the hard mask layer, the composite capping layer, and the top electrode layer, to below or about even with an upper surface of the hard mask layer.

At 212, a second etch is performed through regions of the tantalum oxide based layer, the bottom electrode layer, and the barrier layer unmasked by the hard mask layer and the spacer layer.

At 214, a top insulating layer is formed over the bottom insulating layer, and lining the diffusion barrier layer, the bottom electrode layer, the tantalum oxide based layer, the spacer layer, and the hard mask layer.

At 216, a top interconnect structure is formed with a top ILD layer surrounding the top insulating layer, a top metallization layer overlying the top ILD layer, and a via extending between the top metallization layer and the top electrode layer.

At 218, a forming voltage is applied across the top and bottom electrode layers to form a conductive filament in the tantalum oxide based layer.

While the disclosed method (e.g., the method described by the flowchart 200) is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

With reference to FIGS. 3-13, cross-sectional views of some embodiments of an integrated circuit with a RRAM cell at various stages of manufacture are provided to illustrate the method of FIG. 2. Although FIGS. 3-13 are described in relation to the method, it will be appreciated that the structures disclosed in FIGS. 3-13 are not limited to the method, but instead may stand alone as structures independent of the method. Similarly, although the method is described in relation to FIGS. 3-13, it will be appreciated that the method is not limited to the structures disclosed in FIGS. 3-13, but instead may stand alone independent of the structures disclosed in FIGS. 3-13.

Figure 3:
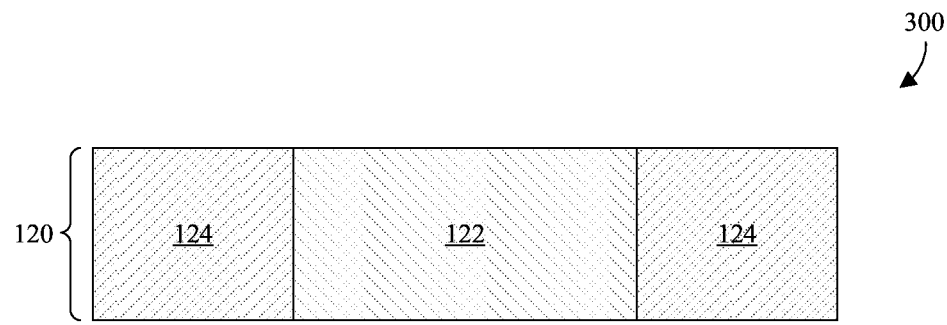
FIGS. 3-13 illustrate a series of cross-sectional views of some embodiments of an integrated circuit at various stages of manufacture, the integrated circuit including a RRAM cell.

FIG. 3 illustrates a cross-sectional view 300 of some embodiments corresponding to Act 202. As illustrated, a bottom interconnect structure 120 (partially shown) is provided. The bottom interconnect structure 120 includes a bottom metallization layer 122 laterally surrounded by a bottom ILD layer 124. The bottom ILD layer 124 may be, for example, an extreme low-κ dielectric, and the bottom metallization layer 122 may be, for example, a metal, such as copper.

Figure 4:
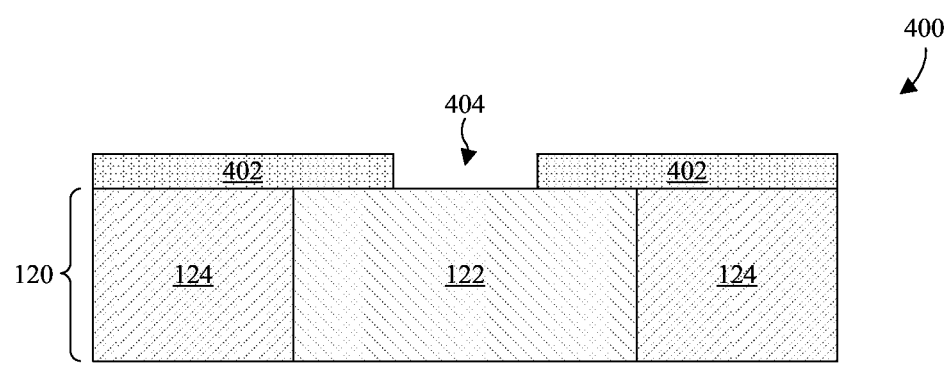

FIG. 4 illustrates a cross-sectional view 400 of some embodiments corresponding to Act 204. As illustrated, a bottom insulating layer 402 is formed over the bottom interconnect structure 120 with a first opening 404 exposing the bottom metallization layer 122. The bottom insulating layer 402 may be, for example, a dielectric, such as silicon dioxide or silicon nitride.

The process for forming the bottom insulating layer 402 may include depositing an intermediate insulating layer over the bottom interconnect structure 120. Further, a photoresist layer may be formed over the intermediate insulating layer and masking regions of the intermediate insulating layer surrounding the first opening 404. With the photoresist layer formed, one or more etchants selective of the intermediate insulating layer may be applied to the intermediate insulating layer according to the photoresist layer. After applying the one or more etchants, the photoresist layer may be removed.

Figure 5:
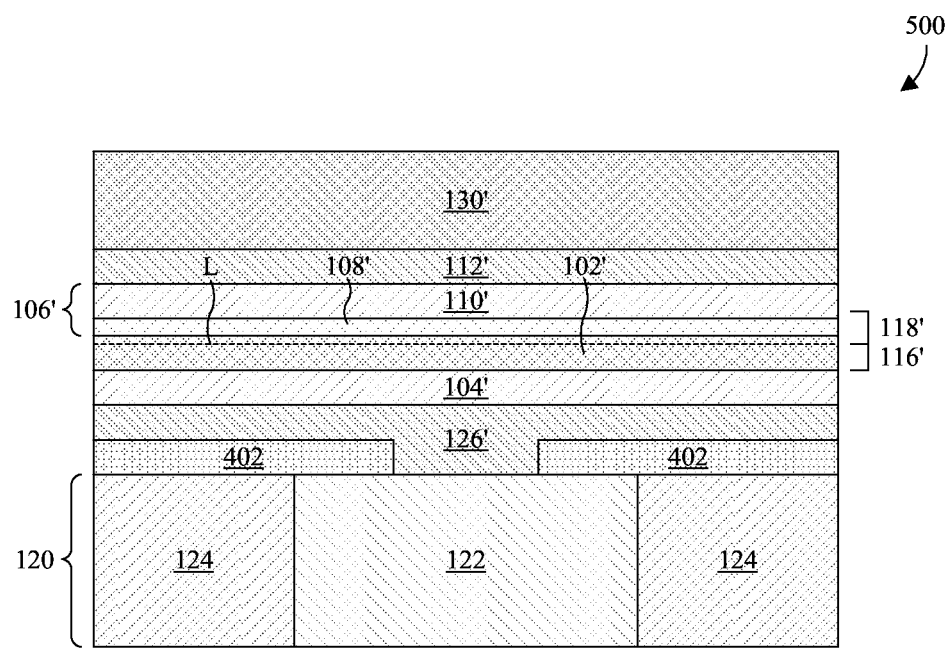

FIG. 5 illustrates a cross-sectional view 500 of some embodiments corresponding to Act 206. As illustrated, a multi-layer stack is formed over the bottom insulating layer 402 and filling the first opening 404. The multi-layer stack is formed by forming a diffusion barrier layer 126' over the bottom insulating layer 402 and filling the first opening 404. The diffusion barrier layer 126' may be, for example, formed of a conductive material, such as polysilicon, titanium nitride, tantalum nitride, platinum, gold, iridium, ruthenium or tungsten.

After forming the diffusion barrier layer 126', a bottom electrode layer 104', a high κ tantalum oxide based layer 102', a high reactivity metal layer 108', a low reactivity metal layer 110', a top electrode layer 112', and a hard mask layer 130' are sequentially formed in that order. The high reactivity metal layer 108' and the low reactivity metal layer 110' define a composite capping layer 106'. The reactivities of the metal layers 108', 110' are relative to each other and correspond to the amounts of energy used to trigger reactions with the tantalum oxide based layer 102'. The high reactivity metal layer 108' may be, for example, formed of hafnium, titanium, zirconium, or lanthanum. The low reactivity metal layer 110' may be, for example, formed of tantalum, aluminum, tungsten, ruthenium, platinum, nickel, copper, or gold. In some embodiments, a combined thickness of the high reactivity metal layer 108' and the low reactivity metal layer 110' is about ½ to about ⅓ of a thickness of the tantalum oxide based layer 102'. The bottom and top electrode layers 104', 112' may be, for example, formed of a conductive material, such as doped polysilicon, titanium nitride, tantalum nitride, platinum, iridium, ruthenium or tungsten. The hard mask layer 130' may be, for example, formed of a dielectric, such as silicon dioxide or silicon nitride.

In some embodiments, after forming the tantalum oxide based layer 102', the high reactivity metal layer 108', and the low reactivity metal layer 110', energy is applied to the tantalum oxide based layer 102', the high reactivity metal layer 108', and the low reactivity metal layer 110' to trigger reactions between the high and low reactivity metal layers 108', 110' and the high κ layer 102. The resulting reactions between the tantalum oxide based layer 102', the high reactivity metal layer 108', and the low reactivity metal layer 110' form an ion reservoir region 118' and a data storage region 116' (demarcated by a dashed line L) in the tantalum oxide based layer 102', the high reactivity metal layer 108', and the low reactivity metal layer 110'. The energy may be, for example, thermally applied by heating the high κ layer 102 and the composite capping layer 106'. Alternatively, the energy may be applied by a voltage across the tantalum oxide based layer 102', the high reactivity metal layer 108', and the low reactivity metal layer 110'.

Figure 6:
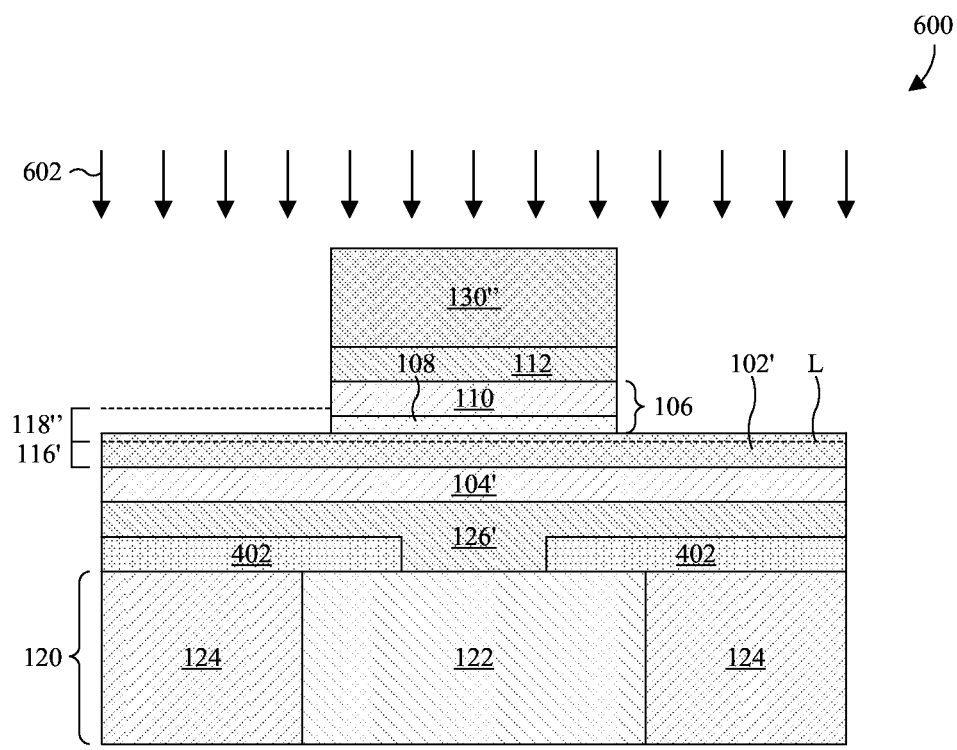

FIG. 6 illustrates a cross-sectional view 600 of some embodiments corresponding to Act 208. As illustrated by FIG. 6, a first etch is performed to the tantalum oxide based layer 102' through regions of the hard mask layer 130', the top electrode layer 112', and the composite capping layer 106' surrounding a device region.

The process for performing the first etch may include forming a photoresist layer masking regions of the hard mask layer 130' corresponding to the device region. An etchant may then be applied to the hard mask layer 130' according to a pattern of the photoresist layer. The etchant may be selective of the hard mask layer 130' relative to the top electrode layer 112'. After applying the etchant, the photoresist layer may be removed and one or more additional etchants 602 may be applied to the top electrode layer 112' and the composite capping layer 106' according to a pattern of the remaining hard mask layer 130".

Figure 7:
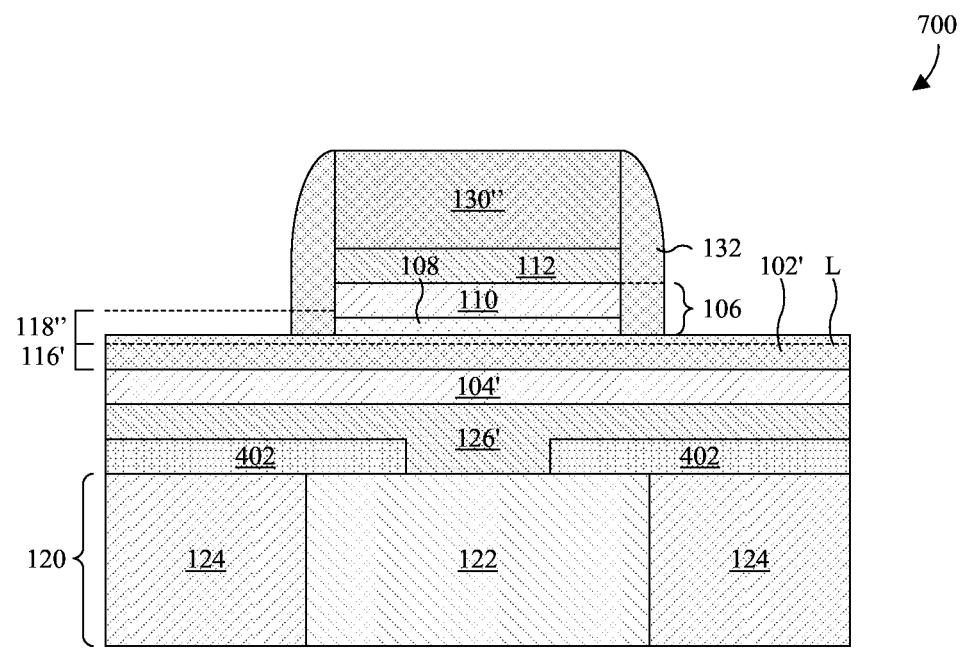

FIG. 7 illustrates a cross-sectional view 700 of some embodiments corresponding to Act 210. As illustrated, a spacer layer 132 is formed over the tantalum oxide based layer 102', and lining sidewalls of the remaining composite capping layer 106, the remaining top electrode layer 112, the remaining hard mask layer 130", and the remaining ion reservoir region 118". The spacer layer 132 extends from about even with an upper surface of the tantalum oxide based layer 102' to about even with an upper surface of the remaining hard mask layer 130". The spacer layer 132 may be, for example, formed of silicon nitride or a multilayer oxide-nitride-oxide film having a nitride layer sandwiched between a pair of oxide layers.

The process for forming the spacer layer 132 may include depositing a conformal, intermediate layer over the tantalum oxide based layer 102', and lining the remaining composite capping layer 106, the remaining top electrode layer 112, and the remaining hard mask layer 130". The intermediate layer may be deposited using a conformal deposition technique, such as chemical vapor deposition (CVD). With the intermediate layer deposited, an etchant may be applied to the intermediate layer for the approximate time it takes the etchant to etch through the thickness of the intermediate layer. The etchant removes lateral stretches of the intermediate layer, thereby resulting in the spacer layer 132.

Figure 8:
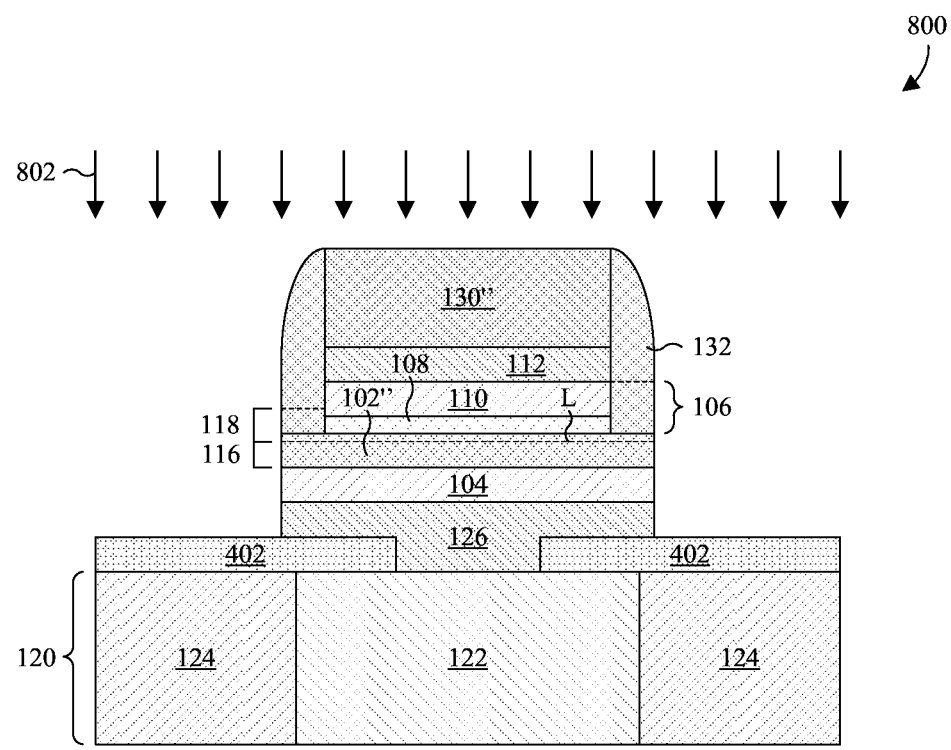

FIG. 8 illustrates a cross-sectional view 800 of some embodiments corresponding to Act 212. As illustrated, a second etch is performed to vertically extend to the tantalum oxide based layer 102', through regions of the tantalum oxide based layer 102', the bottom electrode layer 104', and the diffusion barrier layer 126' unmasked by the remaining hard mask layer 130" and the spacer layer 132. The process for performing the second etch may include applying one or more etchants 802 to regions of the tantalum oxide based layer 102', the bottom electrode layer 104', and the diffusion barrier layer 126' unmasked by the remaining hard mask layer 130" and the spacer layer 132.

Figure 9:
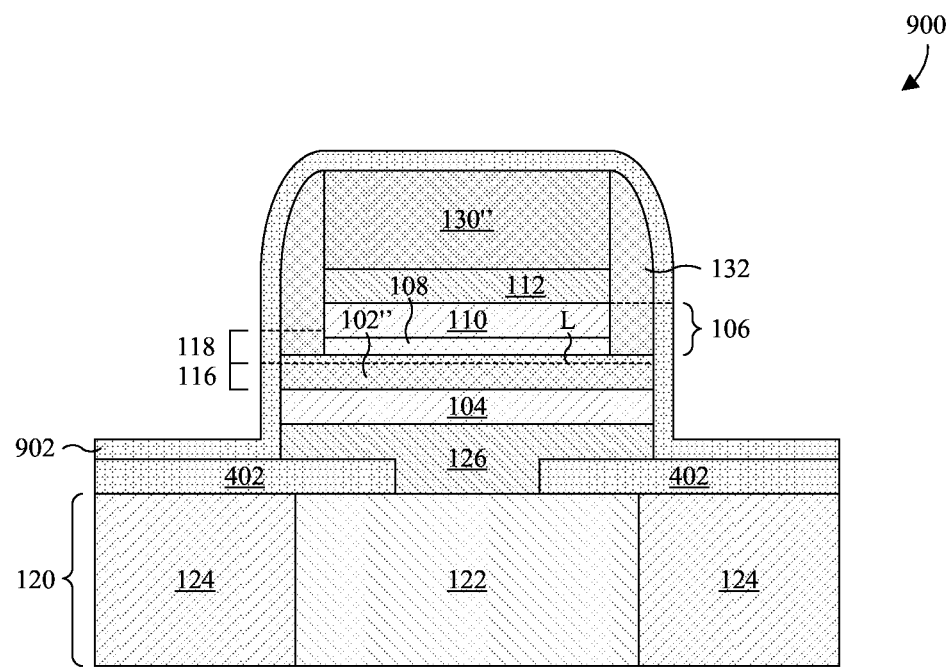

FIG. 9 illustrates a cross-sectional view 900 of some embodiments corresponding to Act 214. As illustrated, a top insulating layer 902 is formed over the bottom insulating layer 402, and lining the remaining diffusion barrier layer 126, the remaining bottom electrode layer 104, the remaining tantalum oxide based layer 102", the spacer layer 132, and the remaining hard mask layer 130". The top insulating layer 902 may be, for example, formed of a dielectric material, such as silicon dioxide or silicon nitride. Further, the top insulating layer 902 may be, for example, formed using a conformal deposition technique.

Figure 10:
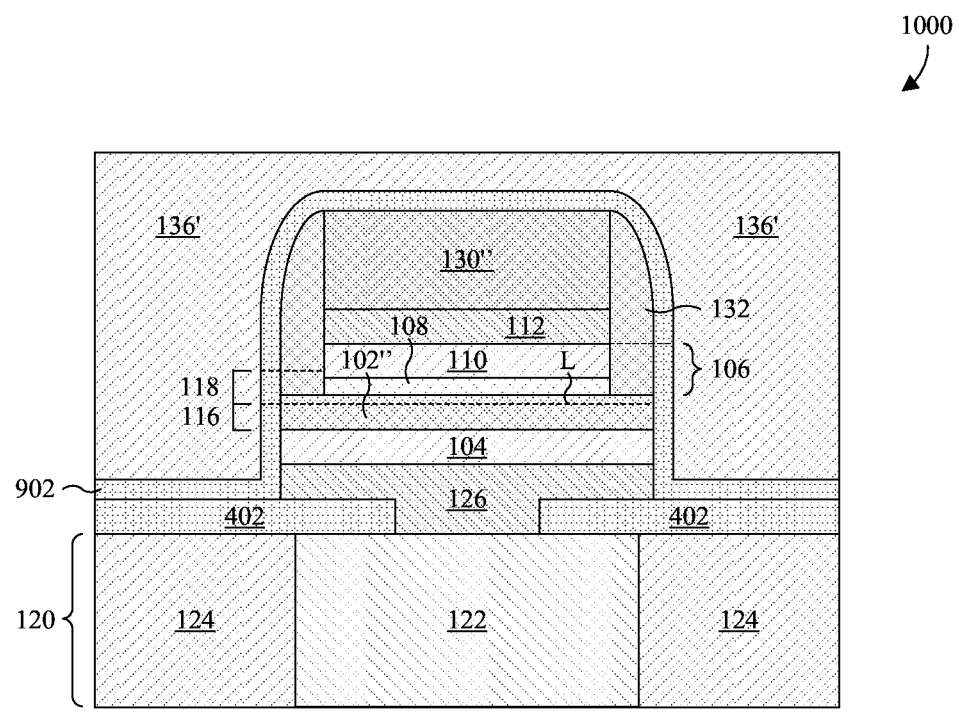
Figure 11:
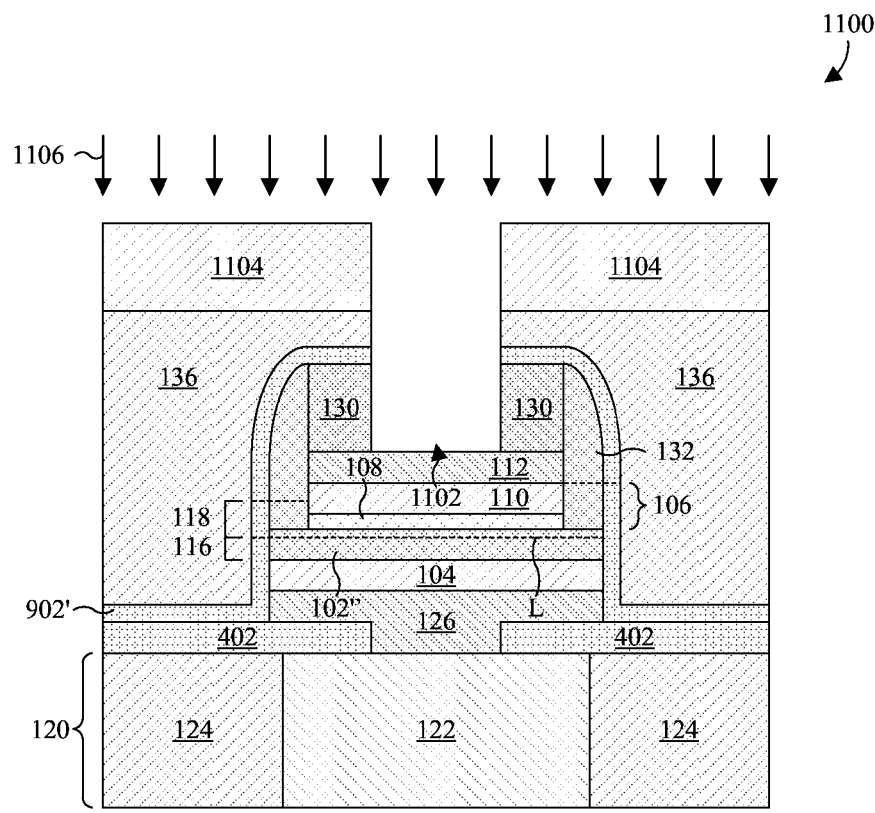
Figure 12:
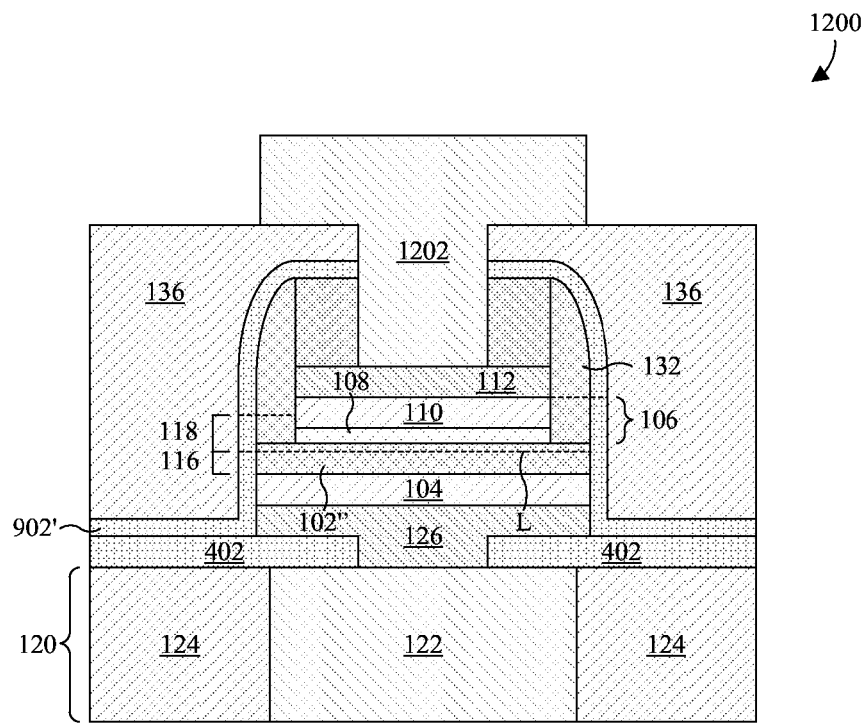

FIGS. 10-12 illustrate cross-sectional views 1000, 1100, 1200 of some embodiments corresponding to Act 216.

As illustrated by FIG. 10, a top ILD layer 136' is formed over and surrounding the top insulating layer 902. The top ILD layer 136' may be, for example, an extreme low-κ dielectric. In some embodiments, the process for forming top ILD layer 136' includes depositing an intermediate ILD layer and performing a chemical mechanical polish (CMP) into the intermediate ILD layer to planarize the top surface of the intermediate ILD layer.

As illustrated by FIG. 11, a third etch is performed to vertically extend to the remaining top electrode layer 112, through regions of the top ILD layer 136', the top insulating layer 902, and the remaining hard mask layer 130" corresponding to a via. The third etch forms a second opening 1102 exposing the remaining top electrode layer 112. The process for performing the third etch may include forming a photoresist layer 1104 over the top ILD layer 136' and masking regions of the top ILD layer 136' surrounding the second opening 1102. One or more etchants 1106 may then be applied to the top ILD layer 136', the top insulating layer 902, and the remaining hard mask layer 130" according to a pattern of the photoresist layer 1104. Thereafter, the photoresist layer 1104 may be removed.

As illustrated by FIG. 12, a conductive layer 1202 is formed filling the second opening 1102, and overhanging the remaining top ILD layer 136 and the remaining top insulating layer 902' around the second opening 1102. The conductive layer 1202 may be, for example, a metal, such as copper or tungsten. The process for forming the conductive layer 1202 may include depositing an intermediate conductive layer over the remaining top ILD layer 136 and filling the second opening 1102. Photolithography may then be used to pattern the conductive layer 1202.

Figure 13:
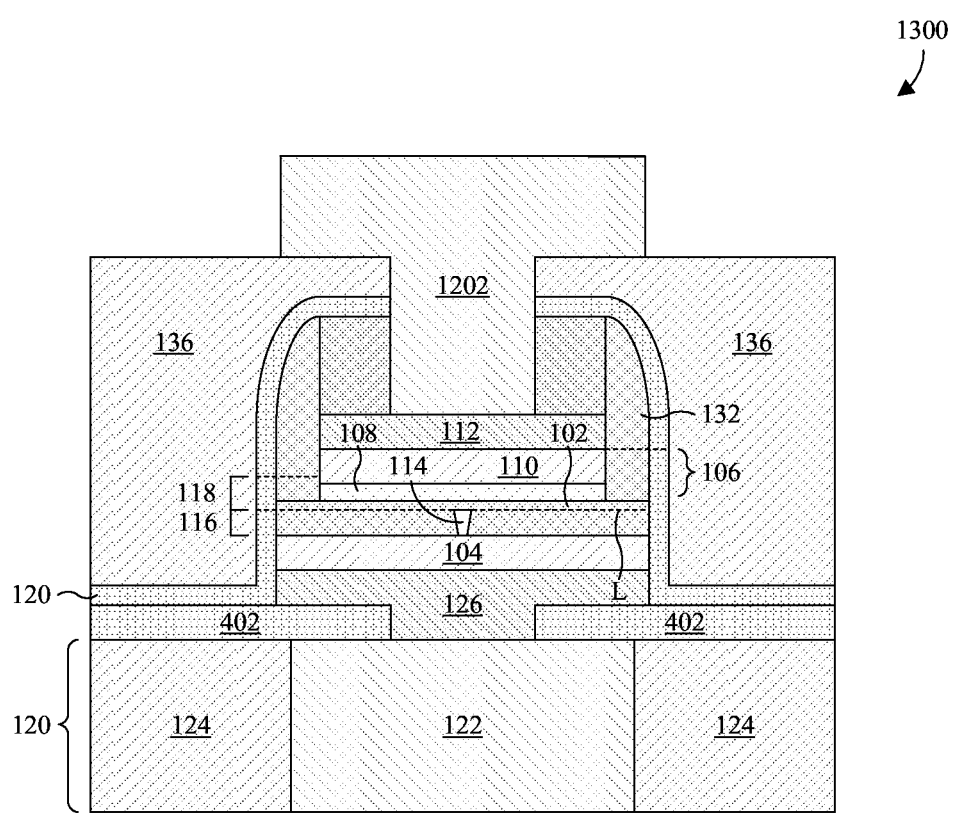

FIG. 13 illustrates a cross-sectional view 1300 of some embodiments corresponding to Act 218. As illustrated, a forming voltage is applied across the remaining top and bottom electrode layers 104, 112 to form one or more conductive filaments 114 in the remaining tantalum oxide based layer 102", typically in the data storage region 116. The forming voltage is high so as to promote the migration of oxygen ions in the remaining tantalum oxide based layer 102" toward the remaining top electrode layer 112. Based on the migration, oxygen vacancies align in the remaining tantalum oxide based layer 102" to form the one or more conductive filaments 114.

Thus, as can be appreciated from above, the present disclosure provides a RRAM cell. A tantalum oxide based layer is arranged over a bottom electrode layer. A composite capping layer is arranged over and abutting the tantalum oxide based layer. The composite capping layer includes a first metal layer and a second metal layer overlying the first metal layer. The first metal layer is more reactive with the tantalum oxide based layer than the second metal layer. A top electrode layer is arranged over the composite capping layer.

In other embodiments, the present disclosure provides a method for manufacturing a RRAM cell. A multi-layer stack includes: a bottom electrode layer; a tantalum oxide based layer arranged over the bottom electrode layer; a first metal capping layer arranged over the tantalum oxide based layer; a second metal capping layer arranged over the first metal capping layer; a top electrode layer arranged over the second metal capping layer; and a hard mask layer arranged over the top electrode layer. The first metal capping layer is more reactive with the tantalum oxide based layer than the second metal capping layer. A first etch is performed vertically extending to the tantalum oxide based layer, through regions of the hard mask layer, the top electrode layer, the first metal capping layer, and the second metal capping layer. A second etch is performed through regions of the bottom electrode layer and the tantalum oxide based layer unmasked by the hard mask layer.

In yet other embodiments, the present disclosure provides an integrated circuit with a RRAM cell. A bottom interconnect structure includes a bottom ILD layer and a bottom metallization layer. A bottom electrode layer overlies the bottom interconnect structure and electrically connected to the bottom metallization layer. A tantalum oxide based layer is arranged over the bottom electrode layer. A composite capping layer is arranged over and abuts the tantalum oxide based layer. The composite capping layer includes a first metal layer and a second metal layer overlying the first metal layer. The first metal layer is more reactive with the tantalum oxide based layer than the second metal layer. A top electrode layer is arranged over the capping layer. A top interconnect structure includes a top ILD layer and a top metallization layer. The top ILD layer is arranged over the bottom ILD layer. The top metallization layer is arranged in the top ILD layer and electrically connected to the top electrode layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A resistive random access memory (RRAM) cell comprising:
   a bottom electrode layer;
   a tantalum oxide based layer arranged over the bottom electrode layer;
   a composite capping layer arranged over and abutting the tantalum oxide based layer, wherein the composite capping layer includes a first metal layer and a second metal layer overlying the first metal layer, wherein the first and second metal layers are elemental metals configured to store oxygen from the tantalum oxide based layer, and wherein the first metal layer is more reactive with the tantalum oxide based layer than the second metal layer; and
   a top electrode layer arranged over the composite capping layer, wherein the top electrode layer and the composite capping layer share a first width, and wherein the tantalum oxide based layer and the bottom electrode layer share a second width greater than the first width.

2. The RRAM cell according to claim 1, wherein the first metal layer includes hafnium, titanium, zirconium, or lanthanum.

3. The RRAM cell according to claim 1, wherein the second metal layer includes tantalum, aluminum, tungsten, ruthenium, or platinum.

4. The RRAM cell according to claim 1, wherein the first metal layer has a lesser thickness than the second metal layer.

5. The RRAM cell according to claim 4, wherein the first metal layer has a thickness less than about 70 angstroms.

6. The RRAM cell according to claim 1, wherein the first metal layer has a thickness of about 10-40 angstroms, and wherein the second metal layer has a thickness of about 75-150 angstroms.

7. The RRAM cell according to claim 1, wherein the tantalum oxide based layer includes tantalum, oxygen, and at least one other element.

8. The RRAM cell according to claim 1, wherein the tantalum oxide based layer is bisected into an upper region and a lower region having a higher oxygen concentration than the upper region, and wherein the RRAM cell further includes:
   a data storage region comprising the lower region, and configured to vary in resistance in response to external electric fields; and
   an ion reservoir region including the first metal layer and the upper region, and configured to store oxygen ions from the data storage region.

9. The RRAM cell according to claim 1, wherein the composite capping layer has a lower concentration of oxygen than the tantalum oxide based layer, and is configured to extract oxygen from the tantalum oxide based layer.

10. The RRAM cell according to claim 1, wherein the tantalum oxide based layer contacts a top surface of the bottom electrode layer, the first metal layer contacts a top surface of the tantalum oxide based layer, the second metal layer contacts a top surface of the first metal layer, the top electrode layer contacts a top surface of the second metal layer, and a via contacts a top surface of the bottom electrode layer.

11. An integrated circuit (IC) with a resistive random access memory (RRAM) cell, the IC comprising:
   a bottom interconnect structure comprising a bottom interlayer dielectric (ILD) layer and a bottom metallization layer;
   a bottom electrode layer overlying the bottom interconnect structure and electrically connected to the bottom metallization layer;
   a tantalum oxide based layer arranged over the bottom electrode layer, wherein the tantalum oxide based layer comprises an upper region and a lower region having a higher oxygen concentration than the upper region;
   a composite capping layer arranged over and abutting the tantalum oxide based layer, wherein the composite capping layer includes a first metal layer and a second metal layer overlying the first metal layer, and wherein the first metal layer is more reactive with the tantalum oxide based layer than the second metal layer;
   a top electrode layer arranged over the composite capping layer, wherein sidewalls of the to electrode layer are aligned with sidewalls of the composite capping layer, wherein sidewalls of the tantalum oxide based layer are aligned with sidewalls of the bottom electrode layer, wherein the top electrode layer and the composite capping layer share a first width, and wherein the tantalum oxide based layer and the bottom electrode layer share a second width greater than the first width;
   a top interconnect structure comprising a top ILD layer and a top metallization layer, wherein the top ILD layer is arranged over the bottom ILD layer, and wherein the top metallization layer is arranged in the top ILD layer and electrically connected to the top electrode layer;
   a data storage region comprising the lower region, and configured to vary in resistance in response to external electric fields; and
   an ion reservoir region including the first metal layer and the upper region, and configured to store oxygen ions from the data storage region.

12. The IC according to claim 11, wherein the first metal layer includes hafnium, titanium, zirconium, or lanthanum, and wherein the second metal layer includes tantalum, aluminum, tungsten, ruthenium, or platinum.

13. The IC according to claim 11, wherein the first metal layer has a smaller thickness than the second metal layer.

14. The IC according to claim 11, wherein the composite capping layer has a lower concentration of oxygen than the tantalum oxide based layer, and is configured to extract oxygen from the tantalum oxide based layer.

15. The IC according to claim 11, wherein a via extends from the top metallization layer to the top electrode layer.

16. The IC according to claim 15, wherein the tantalum oxide based layer contacts a top surface of the bottom electrode layer, the first metal layer contacts a top surface of the tantalum oxide based layer, the second metal layer contacts a top surface of the first metal layer, the top electrode layer contacts a top surface of the second metal layer, and the via contacts a top surface of the bottom electrode layer.

17. A resistive random access memory (RRAM) cell comprising:
   a bottom electrode layer arranged over a diffusion barrier layer;
   a tantalum oxide based layer arranged over the bottom electrode layer, wherein sidewalls of the tantalum oxide based layer are aligned with sidewalls of the diffusion barrier and bottom electrode layers, and wherein the tantalum oxide based layer shares a first width with the diffusion barrier and bottom electrode layers;
a first metal layer arranged over and contacting the tantalum oxide based layer;
a second metal layer arranged over and contacting the first metal layer, wherein a material of the second metal layer is less reactive with a material of the tantalum oxide based layer than a material of the first metal layer; and
a top electrode layer arranged over and contacting the second metal layer, wherein sidewalls of the top electrode layer are aligned with sidewalls of the first and second metal layers, wherein the top electrode layer shares a second width with the first and second metal layers, and wherein the second width is less than the first width.

* * * * *